(12) United States Patent
de Obaldia et al.

(10) Patent No.: US 7,035,750 B2
(45) Date of Patent: Apr. 25, 2006

(54) ON-CHIP TEST MECHANISM FOR TRANSCEIVER POWER AMPLIFIER AND OSCILLATOR FREQUENCY

(75) Inventors: Elida Isabel de Obaldia, Dallas, TX (US); Chih-Ming Hung, McKinney, TX (US); Dirk Leipold, Plano, TX (US); Oren Eliezer, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 91 days.

(21) Appl. No.: 10/759,912

(22) Filed: Jan. 16, 2004

(65) Prior Publication Data

US 2004/0148121 A1 Jul. 29, 2004

Related U.S. Application Data

(60) Provisional application No. 60/441,080, filed on Jan. 17, 2003.

(51) Int. Cl.
 *G01R 31/00* (2006.01)
(52) U.S. Cl. .................... 702/117; 327/205
(58) Field of Classification Search ............ 702/60–62, 702/75, 107, 117, 122, 124, 191, 193; 375/227, 375/376, 296–297; 324/613–615, 624; 330/2, 330/149; 327/205–206
See application file for complete search history.

(56) References Cited

U.S. PATENT DOCUMENTS

| | | | | |
|---|---|---|---|---|
| 3,798,376 A | * | 3/1974 | Limberg | 381/4 |
| 5,255,086 A | * | 10/1993 | McMullan et al. | 725/131 |
| 5,351,016 A | * | 9/1994 | Dent | 332/103 |
| 5,404,054 A | * | 4/1995 | Kotowski | 327/73 |
| 5,747,942 A | * | 5/1998 | Ranganath | 315/224 |
| 5,867,535 A | * | 2/1999 | Phillips et al. | 375/295 |
| 5,880,614 A | * | 3/1999 | Zinke et al. | 327/205 |
| 6,066,990 A | * | 5/2000 | Genest | 331/25 |
| 6,450,184 B1 | * | 9/2002 | Azar | 134/57 R |
| 6,642,764 B1 | * | 11/2003 | Deas et al. | 327/205 |
| 6,654,595 B1 | * | 11/2003 | Dexter | 455/323 |

* cited by examiner

*Primary Examiner*—Marc S. Hoff
*Assistant Examiner*—Mary Catherine Baran
(74) *Attorney, Agent, or Firm*—Alan K. Stewart; W. James Brady, III; Frederick J. Telecky, Jr.

(57) ABSTRACT

An on-chip test mechanism for transceiver power amplifier and oscillator frequency for use with the transmitter portion of an integrated RF transceiver. The RF output from the power amplifier in the transmitter is input to a built-in dedicated analog comparator having a configurable threshold. The threshold is adjusted to a predetermined level at which crossings start to occur at the comparator output. The comparator outputs pulses only if the power amplifier output is above a minimum configurable level. The comparator output is input to a frequency divider whose frequency output is tested by a low cost external tester to determine the actual RF frequency thereby confirming generation of the correct oscillator frequency and that the amplitude of the signal at the output of the power amplifier is sufficiently high for the configurable threshold level to be exceeded, thereby determining the compliance of the output power with its defined specifications.

30 Claims, 4 Drawing Sheets

US 7,035,750 B2

ON-CHIP TEST MECHANISM FOR TRANSCEIVER POWER AMPLIFIER AND OSCILLATOR FREQUENCY

REFERENCE TO RELATED APPLICATIONS

This application is based on U.S. Provisional Application Ser. No. 60/441,080, filed Jan. 17, 2003, entitled "Type-II-All-Digital PLL in Deep-Submicron CMOS", incorporated herein by reference in its entirety.

FIELD OF THE INVENTION

The present invention relates to the field of data communications and more particularly relates to an on-chip test mechanism for a transceiver power amplifier and oscillator frequency for use with a transmitter implemented as an integrated circuit such as those constructed according to the Bluetooth standard.

BACKGROUND OF THE INVENTION

Designing Built-in Test (BIT) or Built-In Self Test (BIST) capabilities into semiconductor devices (i.e. chips) is a well-known technique used to place the circuitry needed to perform critical performance tests directly on the chip rather than off chip. Without the built in test circuitry, external test equipment must be used to perform the various performance tests. Several limitations of using external test equipment include making connections to the on-chip circuitry through a limited number of contact points or pins, requiring expensive test equipment capable of performing RF measurements, and requiring an extended testing time typical of such measurements. On-chip digital or software based mechanisms, which serve to substitute for such external setups, offer significant reduction in testing costs without resulting in a noticeable increase in chip cost.

Manufacturers designing and building products such as communication devices, often design their products to operate in accordance with industry standards. One such standard is the Bluetooth short-range wireless standard. In order to insure conformance with the standard, qualification tests are performed on the products as part of the manufacturing process. Typically, the testing of communication devices requires the device to be connected to one or more pieces of external test equipment that perform a battery of tests to insure compliance with the standard. The test equipment used is typically bulky in size, costly and requires routine maintenance and calibration of its own.

An essential part of the manufacturing process of an RF transceiver is testing the device to ensure compliance with requirements. These requirements may be dictated by customer demands, requirements from the company's marketing department, or an industry standard such as the Bluetooth standard. In order to test the RF portions of a fully integrated RF transceiver chip, special test equipment is typically required that is capable of handling the RF frequencies generated by the chip.

A diagram illustrating a prior art scheme for testing compliance of a transmitter using high cost RF test equipment is shown in FIG. 1. In this typical example, the transmitter, generally referenced 10, is shown comprising an RF modulator 12 connected to a power amplifier 14. The data to be transmitted, either analog or digital, is input to the modulator which generates a transmit signal that is then amplified using a power amplifier before coupling to an antenna (not shown). As part of the manufacturing process, the transmitter circuitry must be tested to ensure compliance with certain performance requirements.

To determine that the power amplifier is operating correctly, the RF output 18 of the transmitter is tested to check whether the appropriate power levels are being generated. Another test checks to make sure the oscillator frequency is within a tolerable range. Such tests are typically performed using high cost RF test equipment 19 which connects to the RF output of the transmitter and may be adapted to control one or more circuit portions within the transmitter via one or more control signals 17.

The RF test equipment needed to guarantee minimum performance of the chip is typically very expensive, driving up the overall cost of manufacturing the chip. In addition, the measurement time required by such external RF capable test equipment is relatively long. A long measurement time limits the throughput of integrated circuit (IC) production and increases the total manufacturing costs.

It is therefore desirable to be able to test the performance of an integrated RF transceiver chip, in particular the power amplifier and oscillator frequency, using very low cost test equipment and which requires short measurement times.

SUMMARY OF THE INVENTION

The present invention provides a solution to the problems of the prior art by providing a transceiver power amplifier and oscillator frequency test mechanism for use with the transmitter portion of an integrated RF transceiver. The mechanism of the present invention does away with the need to use expensive RF test equipment and instead permits the use of very low cost test equipment to test an integrated RF transmitter. A relatively small amount of additional circuitry, however, is required to realize the mechanism within the integrated circuit. Further, this additional circuitry would typically only be used once at the time of IC production testing to ensure the minimum performance of the transmitter. In most cases, however, the additional chip real estate taken up by the test mechanism circuitry, which is not used during normal operation of the chip, is more than offset by the savings in both test time and test cost since high cost RF test equipment is not needed and testing time is reduced.

The RF output from the power amplifier in the transmitter is input to a built-in dedicated analog comparator having a configurable threshold. The comparator is adapted to handle the RF frequency of interest, e.g., 2.4 GHz for Bluetooth. The threshold is adjusted via software to determine the level at which crossings start to occur at the comparator output and thus determine whether the output power of that power amplifier is satisfactory. In addition, the output of the comparator, being a digital square wave, is fed into a frequency divider whose lower frequency output is monitored and tested by a digital tester. Given a Bluetooth RF signal at 2.4 GHz, a divide by 128 yields a relatively low frequency output signal (about 19 MHz). The frequency reading is then analyzed to determine the actual RF frequency (multiply by 128 in this example) to confirm that the correct oscillator frequency signal is being generated (i.e. has the right amplitude, based on the comparator's threshold being configured appropriately).

Note that the test mechanism of the present invention may be used with digital or analog based transmitters. Further, the invention is operative whether the transmitter uses digital or analog modulation. The test mechanism can be used to test the operation of the power amplifier and the frequency of transmission. To test a fixed oscillator frequency, the modulation in the transmitter is turned off or disabled during the test. The mechanism can also be used to test the modulation of the transmitter. In the case of frequency modulation (analog FM or digital FSK), test modulation is applied to generate deviations in the oscillator frequency. The frequency counter output is analyzed for the correct corresponding deviations after frequency division. Depending on the frequency range to be covered (e.g., often several RF bands are addressed by a transmitter, such as in the case of a cellular phone handset) a configurable frequency counter may be used whose degree of frequency division is programmable and wide enough to accommodate the targeted range of frequencies to be tested.

Note that many aspects of the invention described herein may be constructed as software objects that are executed in embedded devices as firmware, software objects that are executed as part of a software application on either an embedded or non-embedded computer system running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the present invention a method of testing a power amplifier and oscillator frequency in an integrated circuit based transmitter, the method comprising the steps of comparing a power amplifier output to a threshold and generating a square wave signal in response thereto, the threshold being adjusted such that the square wave signal is generated only when the power amplifier output voltage amplitude is above a predetermined level and dividing the square wave signal a sufficient number of times to enable frequency counting of a test output generated therefrom at a frequency significantly below that of the oscillator frequency.

There is also provided in accordance with the present invention an apparatus for testing a power amplifier and oscillator frequency in an integrated circuit based transmitter comprising means for comparing a power amplifier output to a threshold and generating a square wave signal in response thereto, the threshold being adjusted such that the square wave signal is generated only when the power amplifier output voltage amplitude is above a predetermined level and means for dividing the square wave signal a sufficient number of times so as to enable frequency counting of a test output generated therefrom at a frequency significantly below that of the oscillator frequency.

There is further provided in accordance with the present invention an apparatus for testing a power amplifier and oscillator frequency in an integrated circuit based transmitter comprising a comparator having a first input and a second input, wherein a power amplifier output signal is connected to the first input and a threshold signal is connected to the second input, the comparator operative to produce a square wave signal, wherein the threshold being adjusted such that the square wave signal is generated only when the power amplifier output voltage amplitude is above a predetermined level and a frequency divider adapted to receive the square wave signal output of the comparator and adapted to divide the frequency of the square wave to within a frequency range sufficiently below that of the oscillator frequency.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
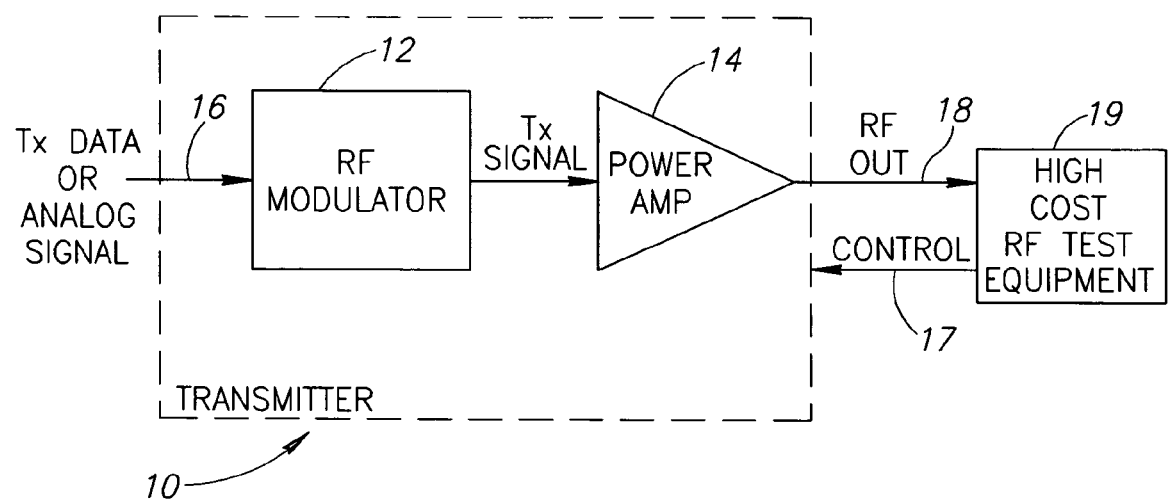
FIG. 1 is a diagram illustrating a prior art scheme for testing compliance of a transmitter using high cost RF test equipment.

The following notation is used throughout this document.

| Term | Definition |
| --- | --- |
| AM | Amplitude Modulation |
| ASIC | Application Specific Integrated Circuit |
| BIST | Built-in Self Test |
| BIT | Built-in Test |
| CMOS | Complementary Metal Oxide Semiconductor |
| DAC | Digital to Analog Converter |
| DSP | Digital Signal Processor |
| DUT | Device Under Test |
| FM | Frequency Modulation |
| FPGA | Field Programmable Gate Array |
| FSK | Frequency Shift Keying |
| GSM | Global System for Mobile Communication |
| HDL | Hardware Description Language |
| IC | Integrated Circuit |
| ISM | Industrial Scientific Medical band |
| PC | Personal Computer |
| PLL | Phase Locked Loop |
| RF | Radio Frequency |

DETAILED DESCRIPTION OF THE INVENTION

The present invention is a test mechanism for a transceiver power amplifier and oscillator frequency for use in testing the transmitter portion of an integrated RF transceiver. The mechanism of the present invention obviates the need to use expensive RF test equipment and instead permits the use of very low cost test equipment to test an integrated RF transmitter. A relatively small amount of additional circuitry, however, is required to realize the mechanism on the integrated circuit. This additional circuitry would typically only be used once at the time of IC production testing to ensure the minimum performance of the transmitter. In most cases, however, the additional chip real estate taken up by the test mechanism circuitry, which is not used during normal operation of the chip is more than offset by the savings in both test time and test cost since high cost RF test equipment is not needed.

To aid in understanding the principles of the present invention, the description is provided in the context of a transceiver adapted to comply with the Bluetooth standard. It is appreciated, however, that the invention is not limited to use with Bluetooth compliant devices but can be applied to devices adapted to comply with other standards as well. In addition, the invention is not limited to use with a specific modulation scheme but is applicable to any modulation scheme including both digital and analog modulation. The invention can be used to ensure that the signal level at the output of the power amplifier and the oscillator frequency comply with a given set of requirements whether part of a standard or not.

A main object of the test mechanism of the present invention is to reduce the costs involved in testing the functionality of the power amplifier and oscillator frequency of a transmitter at a much lower frequency and to verify that the power amplifier output power is above a desired level, e.g., 4 dBm. To accomplish this, the invention provides a built-in circuit with input voltage amplitude threshold detection followed by frequency division. Since a power amplifier is an analog circuit which could have a behavior that typically varies over variances in the manufacturing process, or could altogether be faulty with some probability, there exists a need to verify, by means of an analog measurement, that it complies with its target specification at the time of production.

The mechanism of the present invention serves to convert the need for an external analog measurement to that of a simple digital measurement, which could be performed either by external low cost equipment (described in the first embodiment below) or entirely on-chip by means of dedicated digital hardware and/or software (described in the second embodiment below). In addition, since the RF oscillator is also based on analog circuitry, which cannot be tested by the scanning methods employed for digital circuitry, there is a need to verify its functionality (e.g., center frequency and frequency range). This is accomplished by the present invention without requiring the expensive external test equipment typically used for such tests, since the internal circuitry digitizes the tested entity (i.e. RF frequency in this case) and provides it at a lower (i.e. divided) frequency to be counted by a simple external low-cost tester, or internal circuitry or software, all of which accomplish the high frequency related tests quickly and at lower cost compared to existing expensive RF test equipment.

Figure 2:
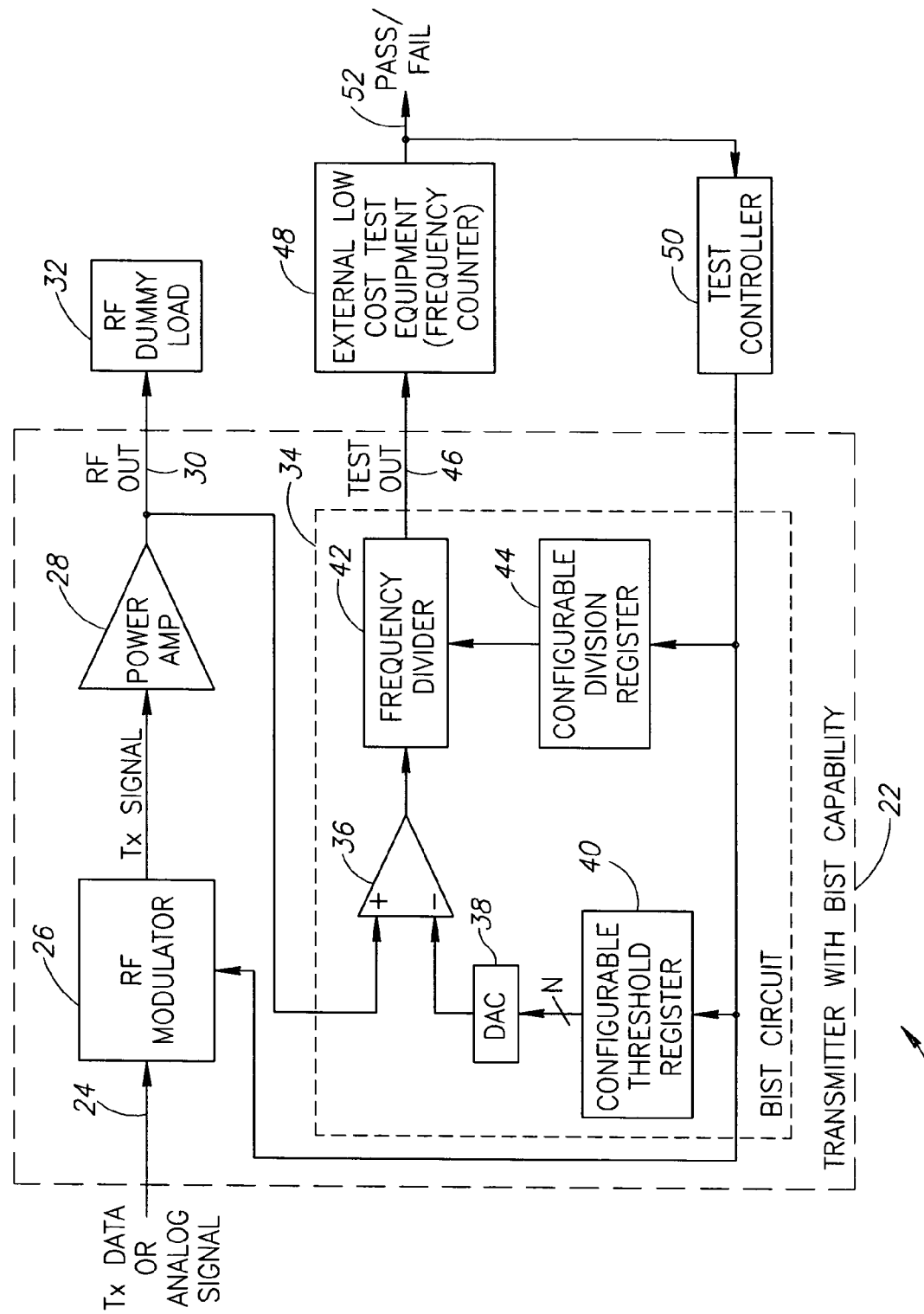
FIG. 2 is a block diagram illustrating a first embodiment of the transceiver power amplifier and oscillator frequency test mechanism of the present invention utilizing low cost external test equipment and internal BIST circuitry.

A block diagram illustrating a first embodiment of the transceiver power amplifier and oscillator frequency test mechanism of the present invention utilizing low cost external test equipment is shown in FIG. 2. The test scheme, generally referenced 20, comprises the device under test (DUT) 22, namely the transmitter with built-in self-test capability (BIST). The transmitter 22 comprises the RF modulator 26, power amplifier 28, analog comparator 36, frequency divider 42, digital to analog converter (DAC) 38, configurable threshold register 40 and configurable division register 44.

In normal operation, the RF modulator functions to modulate the analog or digital transmit data 24. The transmit signal is input to the power amplifier which amplifies the signal to the appropriate output power levels to drive an antenna (not shown). In many transceivers the output power level is adjustable by means of software. In such cases, if various power levels need to be tested, a different configurable threshold would be written into the threshold register 40 for each of the tested power levels. The BIST circuit 34 is preferably completely shutdown in order not to waste power during normal operation. During testing, the RF output 30 is not connected to an antenna but rather to an RF dummy load 32. In addition, during testing, the RF output from the power amplifier in the transmitter is input to the built-in dedicated analog comparator 36 having a configurable threshold. The comparator is adapted to handle the RF frequency of interest, e.g., 2.4 GHz for Bluetooth. The analog threshold level is generated using a configurable threshold register 40 whose N-bit output is input to a DAC 38. The number of bits N required is dependent on the precision required for the analog threshold voltage. The analog output of the DAC is input to one of the two inputs of the comparator. An external computing device 50, e.g., PC, test computer, microprocessor, microcomputer, laptop, etc., functions to write the digital value corresponding to the desired threshold into the register 40 under software control.

The output of the comparator is input to the frequency divider 42. Optionally, the frequency divider is adapted to be configurable. In this case, the configurable division register 44 stores the control word that determines the final division output of the frequency divider. The division register 44 is also under software control of the external computing device 50. The test output signal 46 of the frequency divider is input to an external very low cost test equipment 48. A simple frequency counter may also be used to qualify the oscillator frequency.

Assuming the power amplifier is outputting the proper level of power, the threshold input to the comparator is adjusted via software control to determine the level at which transitions begin to occur at the comparator output. This threshold can then be used to test chips for compliance with the power amplifier output level requirement. In addition, the output of the comparator, being a digital square wave, is fed into a frequency divider whose lower frequency output is monitored and tested by the low cost digital tester 48. The output of the tester 50 is a pass/fail indication 52 used to determine whether the chip meets the qualification requirements.

For example, given a Bluetooth RF signal at 2.4 GHz, a divide by 128 frequency divider yields a 19 MHz output signal. This 19 MHz frequency reading is then analyzed to determine the actual RF frequency (multiply by 128 in this example) to confirm that the correct oscillator frequency signal is being generated. Checking the frequency output of the frequency divider not only tests the frequency of the RF out signal but also tests the power amplifier. This is because if the power amplifier does not meet the minimum power output requirement, the level at the input of the comparator would never exceed the threshold (assuming it is configured appropriately) and hence no transitions would be present at the output of the comparator. This would result in a frequency of zero or a frequency much lower than expected. Thus, the expected output from the frequency divider is observed only when the power amplifier output amplitude is large enough, indicating that the power amplifier is functional and can generate the required minimum output power.

Figure 3:
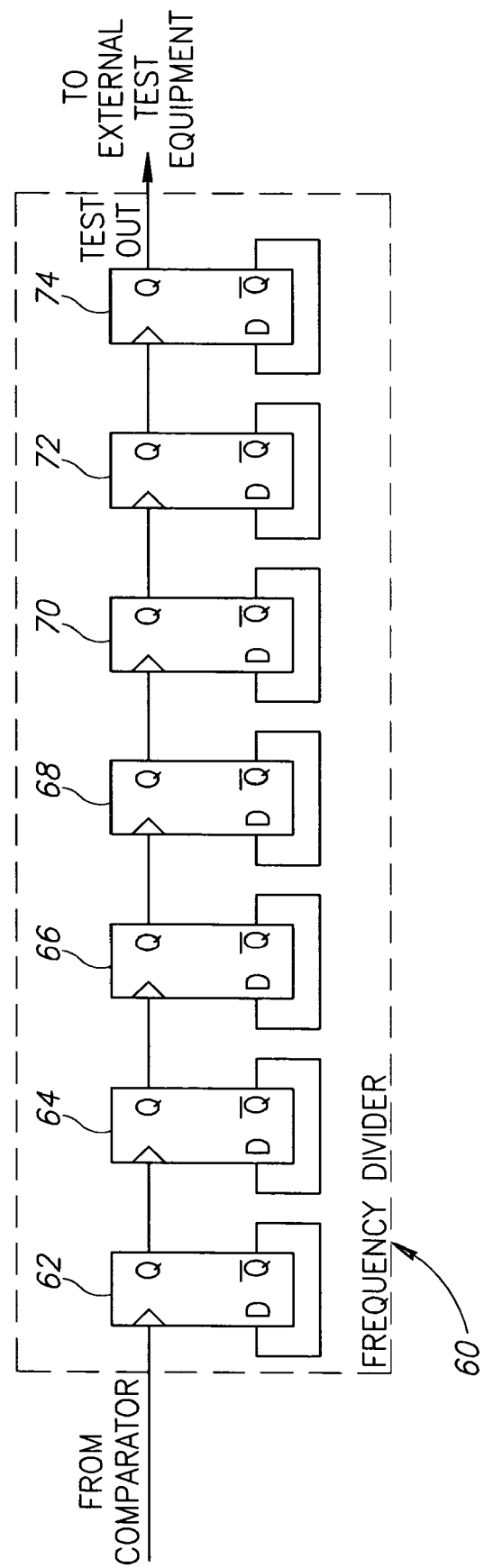
FIG. 3 is a block diagram illustrating in more detail the frequency divider of the on-chip test mechanism of the present invention.

A block diagram illustrating in more detail the frequency divider of the on-chip test mechanism of the present invention is shown in FIG. 3. The example frequency divider shown, generally referenced 60, comprises a plurality of D-type flip flops 62, 64, 66, 68, 70, 72, 74. The frequency divider shown is a 7-stage ripple counter which divides the input frequency by $2^7=128$. In the Bluetooth example provided herein, the square wave output from the comparator is normally at the RF output frequency of 2.4 GHz. It is important that the flip flops used to construct the frequency divider are able to operate with the frequencies present at their inputs. This is especially important for the first few flip flops as these must handle the high RF frequencies. The flip flops further down the line do not require such high frequency capability. It is noted that flip flops able to handle high frequencies such as in the 2.4 GHz or 5.7 GHz ISM bands are well known in the art.

Note that the test mechanism of the present invention can be used to test either a fixed or multilevel (i.e. variable) power amplifier output. In the former case, only a single threshold value is required to test the performance of the power amplifier. In the latter case, a different threshold value is written to the configurable threshold register during the test procedure. Each different threshold value corresponds to a different power amplifier output power level. For each output power level, the appropriate analog threshold input to the comparator is applied by writing different values to the threshold register.

The invention may be used to test transmitters having either fixed or multiple oscillator frequency bands as well. In the case of a single oscillator frequency band, use of a fixed frequency divider in the BIST circuit is sufficient. In the case of multiple oscillator frequency bands, as would be needed in a multi-band GSM handset, a programmable frequency divider may be used in the BIST circuit to ensure that the output frequency is always within a desired narrow range. Such frequency dividers are well known in the art and may be constructed by inserting one or more multiplexers into the circuit. For example, a multiplexer may be used to select either the output or the input of the last flip-flop in the divider to provide an adjustment of 2×, as could be needed for a dual band transceiver where the upper band is at approximately 2× the lower band. An example of such system is the GSM system which has bands at 900 MHz and 1.8 GHz.

Note also that the test mechanism of the present invention may be used with digital or analog based transmitters. Further, the invention can be used not only to test the carrier signal of the transmitter but can also be used to test transmitter modulation as well, regardless of whether the modulator is digital or analog based. To test a fixed oscillator frequency, the carrier frequency is permitted to run without any modulation input during the test, i.e. the modulation circuit in the transmitter is turned off or disabled. In the case of frequency modulation (FM), a test signal is applied to the RF modulator 26 (FIG. 2) to produce test modulation. The test modulation causes a certain frequency deviation in the local oscillator signal used to generate transmit signal. The test output of the frequency divider is then analyzed for the correct corresponding deviation.

The test mechanism can also be used to test amplitude modulation (AM). This is achieved by applying a certain test input to the modulator so as to generate a known (fixed) amount of amplitude modulation of the carrier signal. Under software control, the appropriate threshold level corresponding to the test modulation is applied to the comparator. If the modulation circuit is operating correctly, a square wave at the carrier frequency is generated and the external test equipment can check the test output of the frequency divider for the correct frequency.

Further, the test of the power amplifier and oscillator frequency may be performed using a dummy RF load or no load at all, depending on the application. An external dummy RF load would typically be built into the test board which the device under test is placed in for testing. Alternatively, the dummy RF load may be incorporated internally on-chip integral with the transmitter. In either case, knowing both the impedance of the dummy RF load at the RF output and the output impedance of the transmitter itself permits the calculation of the expected voltage level at the RF output of the chip. Thus, the output power of the amplifier can be measured by measuring the voltage generated at the output, which is determined by the configurable comparator. Once the ratio of the internal and external loads during testing is known, the appropriate threshold to be applied to the comparator can be determined. In similar fashion, if the chip is tested with no RF load (i.e. infinite load), the appropriate threshold voltage to be applied to the comparator can also be determined.

Figure 4:
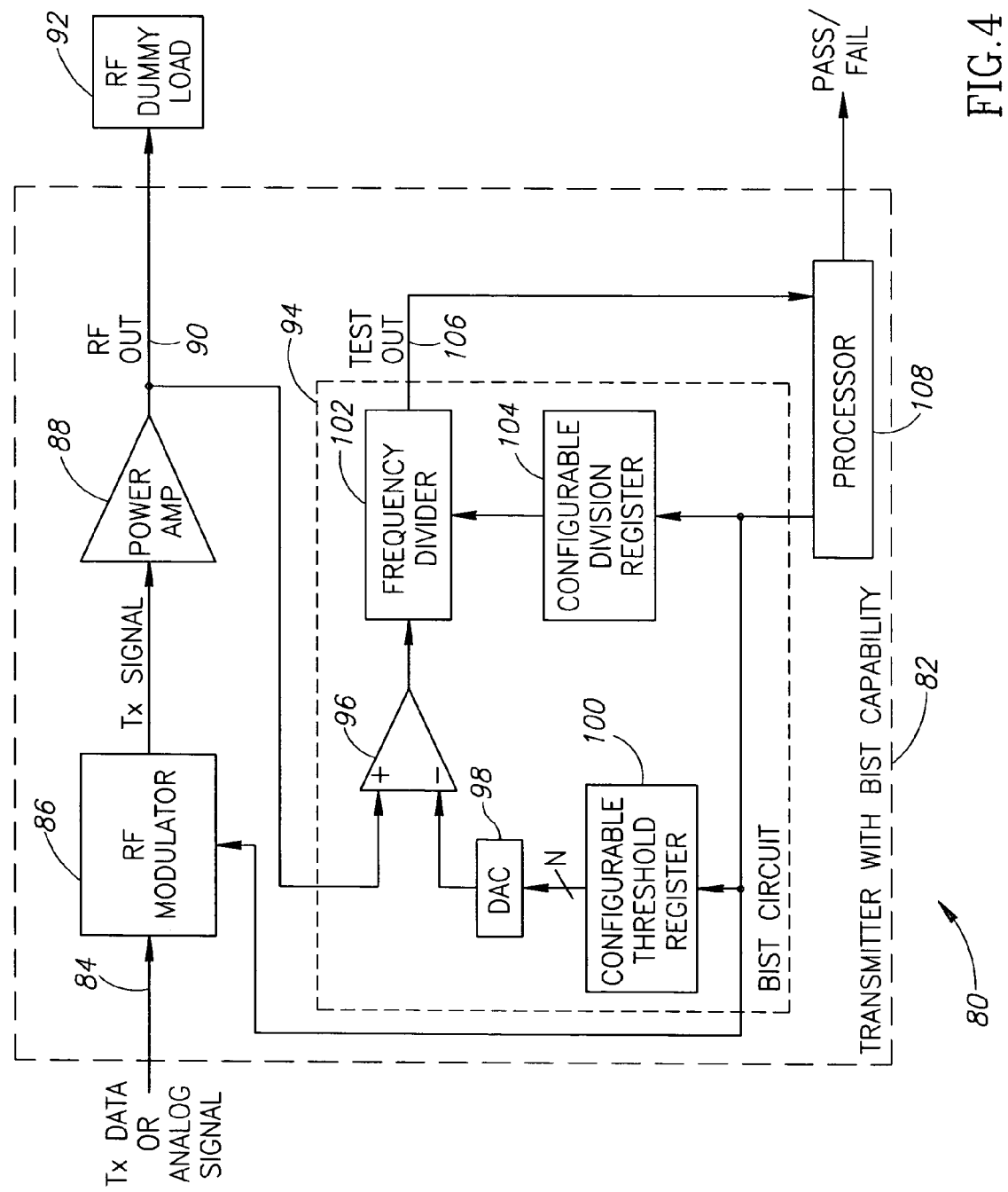
FIG. 4 is a block diagram illustrating a second embodiment of the transceiver power amplifier and oscillator frequency test mechanism of the present invention utilizing an internal processor and BIST circuitry.

In transceivers incorporating a built-in processor (e.g., controller, microprocessor, FPGA or ASIC processor core, DSP, dedicated hardware, etc.) the test controller block 50 (FIG. 2) may be realized in its entirety on-chip, thereby further reducing the need for external testing resources. A block diagram illustrating a second embodiment of the power amplifier and oscillator frequency test mechanism of the present invention utilizing an internal processor and BIST circuitry is shown in FIG. 4. The test scheme, generally referenced 80, comprises the device under test (DUT) 82, namely the transmitter with built-in self-test (BIST) circuit 94 and internal processor 108. The transmitter 82 comprises the RF modulator 86 adapted to receive the Tx data or analog signal 84, power amplifier 88 adapted to output an RF out signal 90, analog comparator 96, frequency divider 102 adapted to output a test out signal 106, digital to analog converter (DAC) 98, configurable threshold register 100 and configurable division register 104.

The operation of the BIST circuit of FIG. 4 is similar to that of FIG. 2 with the difference being that the on-chip processor performs the functionality of and replaces the external test controller and frequency counter. For the case of an on-chip software based processor (e.g., microprocessor or DSP) used to perform the test, the testing software is adapted to configure, control and interface with the HF modulator, configurable threshold register and configurable division register. At the conclusion of a test, the processor is adapted, under software control, to read the test out signal output of the frequency divider.

Note that the software required to perform the testing and adapted to execute on the processor is loaded into rewritable memory (i.e. RAM) used by the processor. Once testing is complete, the testing software is no longer needed and can be replaced with the normal operation software, thereby eliminating the need for dedicated memory allocation for production testing purposes.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of testing a power level and oscillator frequency of a power amplifier in an integrated circuit based transmitter, said method comprising the steps of:

comparing a power amplifier output to a threshold and generating a square wave signal in response thereto, said threshold being adjusted such that said square wave signal is generated only when said power amplifier output voltage amplitude is above a predetermined level;

dividing said square wave signal a sufficient number of times to enable frequency counting of a test output generated therefrom at a frequency significantly below that of said oscillator frequency;
wherein a frequency count of zero or significantly below an expected level indicates a failure of said power amplifier to generate an acceptable output power level; and
wherein said predetermined level is set to screen said transmitter for compliance with a minimum power output level by said power amplifier.

2. The method according to claim 1, wherein said threshold is dynamically configurable.

3. The method according to claim 1, wherein said step of dividing comprises the step of dividing said square wave to a sufficiently low frequency to permit frequency counting using relatively low cost external test equipment.

4. The method according to claim 1, wherein said step of dividing comprises the step of dividing said square wave to a sufficiently low frequency thereby permitting frequency counting using existing on-chip processing means adapted to perform frequency counting.

5. The method according to claim 1, wherein said step of dividing comprises, for a 2.4 GHz oscillator frequency, the step of dividing said square wave by 128 to yield approximately a 19 MHz test output signal.

6. The method according to claim 1, wherein the division ratio for said square wave is divided is dynamically configurable.

7. The method according to claim 1, further comprising the step of applying said test output signal to a relatively low cost external frequency counter to verify compliance with a desired oscillator frequency.

8. The method according to claim 1, further comprising the step of applying said test output signal to an on-chip software/hardware based block adapted to verify compliance with a desired oscillator frequency range by means of frequency counting.

9. The method according to claim 1, wherein said oscillator frequency signal comprises carrier signal only.

10. The method according to claim 1, wherein said oscillator frequency signal comprises carrier signal combined with a modulating signal.

11. An apparatus for testing a power level and oscillator frequency of a power amplifier in an integrated circuit based transmitter, comprising:
    means for comparing a power amplifier output to a threshold and generating a square wave signal in response thereto, said threshold being adjusted such that said square wave signal is generated only when said power amplifier output voltage amplitude is above a predetermined level;
    means for dividing said square wave signal a sufficient number of times so as to enable frequency counting of a test output generated therefrom at a frequency significantly below that of said oscillator frequency;
wherein a frequency count of zero or significantly below an expected value indicates a failure of said power amplifier to generate an acceptable output power level; and
wherein said predetermined level is set to screen said transmitter for compliance with a minimum power output level by said power amplifier.

12. The apparatus according to claim 11, wherein said threshold is dynamically configurable.

13. The apparatus according to claim 11, wherein said means for dividing is adapted to divide said square wave to a sufficiently low frequency to permit frequency counting using relatively low Cost external test equipment.

14. The apparatus according to claim 11, wherein said means for dividing is adapted to divide said square wave, derived from a 2.4 GHz oscillator frequency, by 128 to yield approximately a 19 MHz test Output signal.

15. The apparatus according to claim 11, wherein the division ratio by which the frequency of said square wave is divided is dynamically configurable.

16. The apparatus according to claim 11, further comprising means for applying said test output signal to a relatively low cost external frequency Counter to verify compliance with a desired oscillator frequency.

17. The apparatus according to claim 11, wherein said oscillator frequency signal comprises carrier signal only.

18. The apparatus according to claim 11, wherein said oscillator frequency signal comprises carrier signal combined with a modulating signal.

19. An apparatus for testing a power level and oscillator frequency of a power amplifier in an integrated circuit based transmitter, comprising:
    a comparator having a first input and a second input, wherein a power amplifier output signal is connected to said first input and a threshold signal is connected to said second input, said comparator operative to produce a square wave signal, wherein said threshold being adjusted such that said square wave signal is generated only when said power amplifier output voltage amplitude is above a predetermined level;
    a frequency divider adapted to receive the square wave signal output of said comparator and adapted to divide the frequency of said square wave to within a frequency range sufficiently below that of said oscillator frequency;
wherein a frequency count of zero indicates a failure of said power amplifier to generate an acceptable output power level; and
wherein said predetermined level is set to screen said transmitter for compliance with a minimum power output level by said power amplifier.

20. The apparatus according to claim 19, further comprising a configurable threshold register coupled to said second input of said comparator through a digital-to-analog converter, wherein said threshold register is adapted to be configurable via software or hardware means.

21. The apparatus according to claim 19, wherein said frequency divider is configurable and coupled to a configurable division register, wherein said division register is adapted to be configurable via software or hardware means.

22. The apparatus according to claim 19, wherein said threshold is dynamically configurable.

23. The apparatus according to claim 19, wherein said means for dividing is adapted to divide said square wave to a sufficiently low frequency to permit frequency counting using relatively low cost external test equipment.

24. The apparatus according to claim 19, wherein said means for dividing is adapted to divide said square wave to a sufficiently low frequency to permit frequency counting using internal processing means.

25. The apparatus according to claim 19, wherein said frequency divider is adapted to divide the frequency of said square wave to within a frequency range sufficiently below that of said oscillator frequency to enable frequency counting by on-chip processor means utilizing appropriate software adapted to execute on said processor means.

26. The apparatus according to claim 19, wherein said means for dividing is adapted to divide said square wave, derived from a 2.4 GHz oscillator frequency, by 128 to yield approximately a 19 MHz test output signal.

27. The apparatus according to claim 19, wherein the division ratio for said square wave is divided is dynamically configurable.

28. The apparatus according to claim 19, further comprising means for applying said test output signal to a relatively low cost external frequency counter to verify compliance with a desired oscillator frequency.

29. The apparatus according to claim 19, wherein said oscillator frequency signal comprises carrier signal only.

30. The apparatus according to claim 19, wherein said oscillator frequency signal comprises carrier signal combined with a modulating signal.

* * * * *